US 8,837,199 B2

(12) United States Patent
Kanno et al.

(10) Patent No.: US 8,837,199 B2
(45) Date of Patent: Sep. 16, 2014

(54) SEMICONDUCTOR MEMORY DEVICE

(75) Inventors: Hiroshi Kanno, Mie-ken (JP); Yoichi Minemura, Mie-ken (JP); Mizuki Kaneko, Kanagawa-ken (JP); Tomonori Kurosawa, Kanagawa-ken (JP); Takafumi Shimotori, Kanagawa-ken (JP); Takayuki Tsukamoto, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 209 days.

(21) Appl. No.: 13/599,265

(22) Filed: Aug. 30, 2012

(65) Prior Publication Data
US 2013/0229852 A1    Sep. 5, 2013

(30) Foreign Application Priority Data

Nov. 28, 2011   (JP) .................................. 2011-258682

(51) Int. Cl.
G11C 11/00    (2006.01)
G11C 13/00    (2006.01)
(52) U.S. Cl.
CPC ........ G11C 13/0069 (2013.01); *G11C 2213/72* (2013.01); *G11C 2213/71* (2013.01); G11C 13/0097 (2013.01)
USPC ............................ 365/148; 365/158; 365/163
(58) Field of Classification Search
CPC ........... G11C 13/0069; G11C 2213/72; G11C 13/0004; G11C 13/004; G11C 2213/71; G11C 5/063; G11C 17/18; G11C 2213/77
USPC .......................................... 365/148, 158, 163
See application file for complete search history.

(56) References Cited

U.S. PATENT DOCUMENTS

| 7,688,614 | B2 | 3/2010 | Morimoto |
| 8,467,229 | B2* | 6/2013 | Ikeda et al. .................. 365/148 |
| 8,605,485 | B2* | 12/2013 | Kanno et al. ................. 365/148 |
| 2005/0169043 | A1 | 8/2005 | Yokoyama et al. |
| 2010/0027317 | A1 | 2/2010 | Maejima |
| 2010/0232198 | A1 | 9/2010 | Maejima et al. |
| 2010/0232208 | A1* | 9/2010 | Maejima et al. .............. 365/148 |
| 2011/0051492 | A1 | 3/2011 | Toda |
| 2011/0235400 | A1* | 9/2011 | Shimotori et al. ............ 365/148 |

FOREIGN PATENT DOCUMENTS

| JP | 2005-244145 | 9/2005 |
| JP | 2007-164925 | 6/2007 |
| JP | 2010-33676 | 2/2010 |
| JP | 2010-211898 | 9/2010 |
| JP | 2011-54246 | 3/2011 |

* cited by examiner

*Primary Examiner* — Hien Nguyen
(74) *Attorney, Agent, or Firm* — Oblon, Spivak, McClelland, Maier & Neustadt, L.L.P.

(57) ABSTRACT

According to one embodiment, a semiconductor memory device includes a semiconductor substrate, a plurality of memory cells, a plurality of wires, and a control circuit. The control circuit allows a first current to change a state to flow on a selected cell by applying a first potential difference between a pair of wires that sandwich the selected cell selected from the plurality of memory cells with respect to the semiconductor substrate vertically, and allows a second current lower than the first current to flow on an non-selected cell in the same direction as the direction of the first current by applying a second potential difference between a pair of wires that sandwich the non-selected cell connected to a wire shared with the selected cell on a different layer from the selected cell.

17 Claims, 5 Drawing Sheets

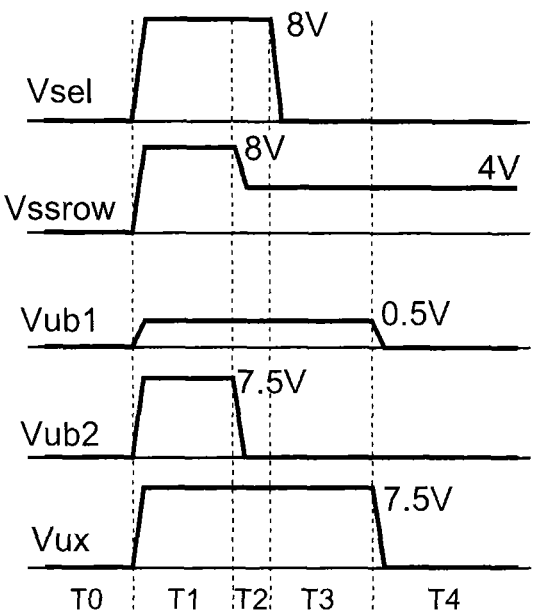
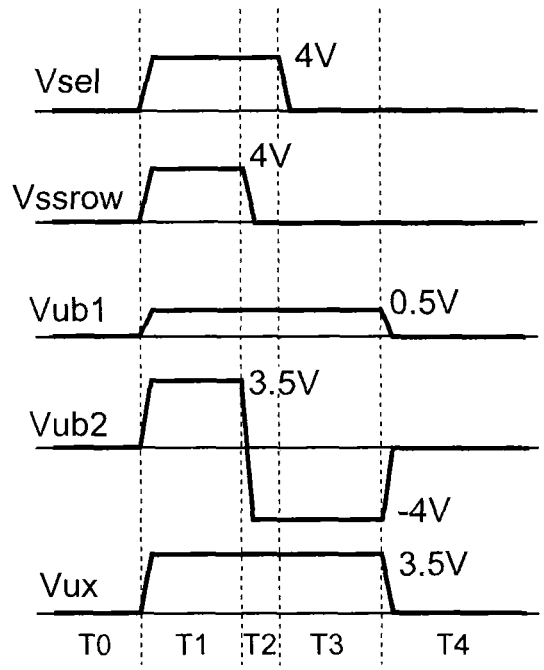

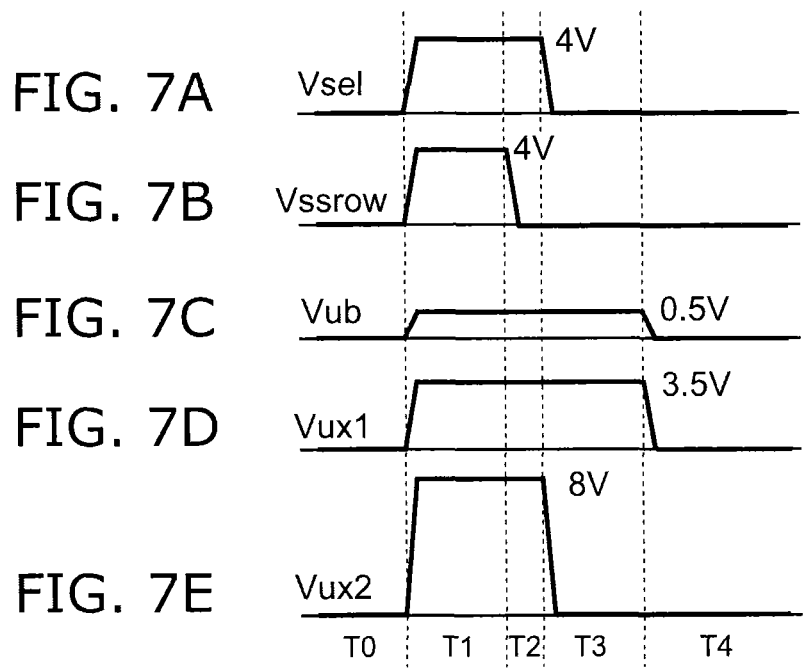

US 8,837,199 B2

SEMICONDUCTOR MEMORY DEVICE

CROSS-REFERENCE TO RELATED APPLICATIONS

This application is based upon and claims the benefit of priority from the prior Japanese Patent Application No. 2011-258682, filed on Nov. 28, 2011; the entire contents of which are incorporated herein by reference.

FIELD

Embodiments described herein relate generally to a semiconductor memory device.

BACKGROUND

In a semiconductor memory device using a state change of a memory cell, when a current ratio of the width of a wire such as a bit line or a word line increases, a voltage drop by wiring resistance increases and a uniform operation which is not dependent on a distance from a driver becomes difficult.

BRIEF DESCRIPTION OF THE DRAWINGS

FIGS. 4A to 4E are timing charts of potential application when the selected cell 122 is reset;

FIGS. 5A to 5E are timing charts of another detailed example of potential application when the selected cell 122 is reset;

FIGS. 7A to 7E are timing charts of potential application when the selected cell 122 is reset.

DETAILED DESCRIPTION

Figure 1:
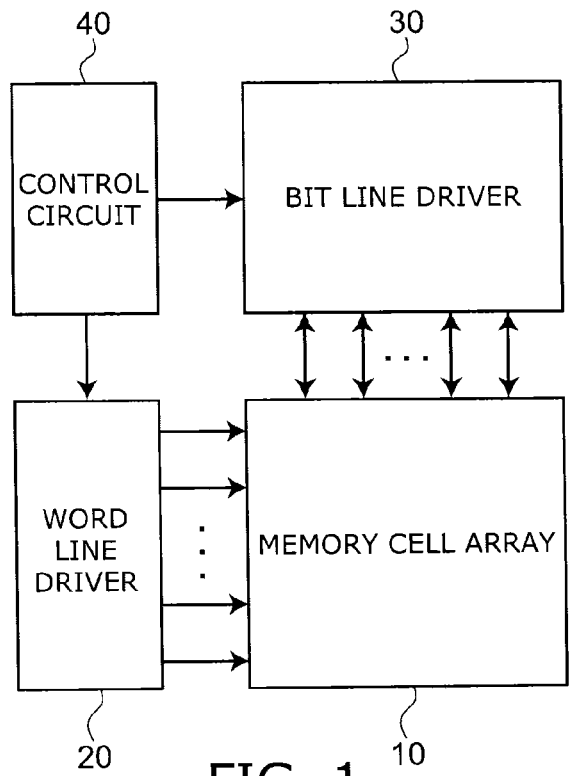
FIG. 1 is a block diagram illustrating a configuration of a semiconductor memory device according to an embodiment.

In general, according to one embodiment, a semiconductor memory device includes a semiconductor substrate, a plurality of memory cells 3-dimensionally arranged on the semiconductor substrate, a plurality of wires stacked in three layers or more with the memory cells interposed thereamong, and a control circuit. The control circuit is configured to allow a first current to change a state to flow on a selected cell by applying a first potential difference between a pair of wires that sandwich the selected cell selected from the plurality of memory cells with respect to the semiconductor substrate vertically. The control circuit is configured to allow a second current lower than the first current to flow on an non-selected cell in the same direction as the direction of the first current by applying a second potential difference between a pair of wires that sandwich the non-selected cell connected to a wire shared with the selected cell on a different layer from the selected cell.

According to another embodiment, a semiconductor memory device includes a plurality of memory cells arranged three-dimensionally, a plurality of wires stacked in three layers or more with the memory cells interposed thereamong, and a control circuit. The control circuit is configured to allow a first current to change a state to flow on a selected cell by applying a first potential difference between a pair of wires that sandwich the selected cell selected from the plurality of memory cells. The control circuit is configured to apply a second potential difference between a pair of wires sandwiching a first non-selected cell connected to a wire shared with the selected cell on the same layer as the selected cell. The control circuit is configured to apply a third potential difference different from the second potential difference between a pair of wires sandwiching a second non-selected cell connected to the wire shared with the selected cell and the first non-selected cell on a different layer from the selected cell and the first non-selected cell.

Hereinafter, with reference to drawings, embodiments will be described. In the drawings, like components are denoted by like reference numerals.

FIG. 1 is a block diagram illustrating a configuration of a semiconductor memory device according to an embodiment.

The semiconductor memory device according to the embodiment includes a memory cell array 10, a word line driver 20, a bit line driver 30, and a control circuit 40.

As described below, the memory cell array 10 has a plurality of 3D arranged memory cells and a plurality of wires (word lines and bit lines) stacked in three layers or more with the memory cells interposed thereamong.

The control circuit 40 controls reading, writing, and erasing operations of the memory cell array 10 by controlling the word line driver 20 and the bit line driver 30 based on an address input, a data input, and a control signal input.

The word line driver 20 applies a potential to the word lines of the memory cell array 10 based on controlling of the control circuit 40. The bit line driver 30 applies a potential to the bit lines of the memory cell array 10 based on controlling of the control circuit 40.

Figure 2:
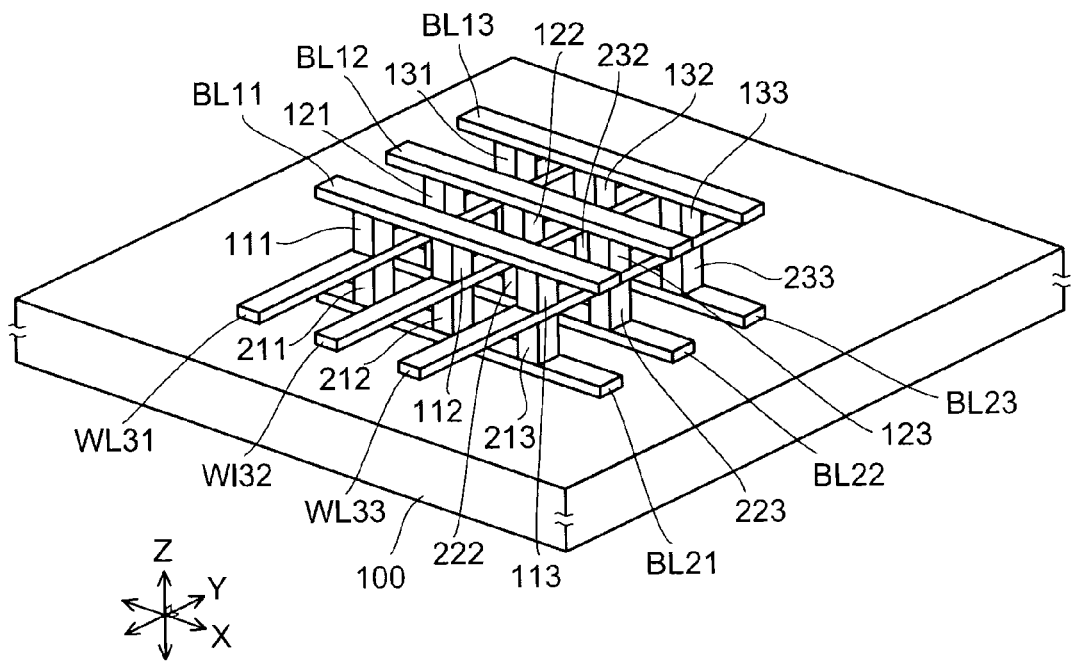
FIG. 2 is a partial schematic perspective view of the memory cell array 10.

FIG. 2 is a partial schematic perspective view of the memory cell array 10.

The memory cell array 10 has a plurality of word lines WL31, WL32, and WL33 and a plurality of bit lines BL11, BL12, BL13, BL21, BL22, and BL23. Further, in the following description, the individual word lines may be denoted by the reference numeral WL without discrimination. Similarly, the individual bit lines may be denoted by the reference numeral BL without discrimination.

The memory cell array 10 has memory cells 111, 112, 113, 121, 122, 123, 131, 132, 133, 211, 212, 213, 222, 223, 232, and 233 interposed vertically with respect to a peripheral surface of a semiconductor substrate 100, between the word line WL and the bit line BL.

The word line WL and the bit line BL are non-parallel, and cross each other three-dimensionally, in a planar view. Each memory cell is installed at a cross point where the word line WL and the bit line BL cross each other.

For example, the plurality of memory cells is arranged on the semiconductor substrate 100 such as a silicon substrate in a matrix pattern in a 2-dimensional direction (XY direction). Further, the plurality of matrix-pattern cell arrays is stacked in a Z direction (a direction vertical to the peripheral surface of the semiconductor substrate 100) perpendicular to an XY plane. FIG. 2 illustrates a part where, for example, a cell array of 3 rows×3 columns is stacked in two layers.

Each word line WL is shared among vertical memory cells. Similarly, each bit line BL is shared among vertical memory cells.

Figure 3:
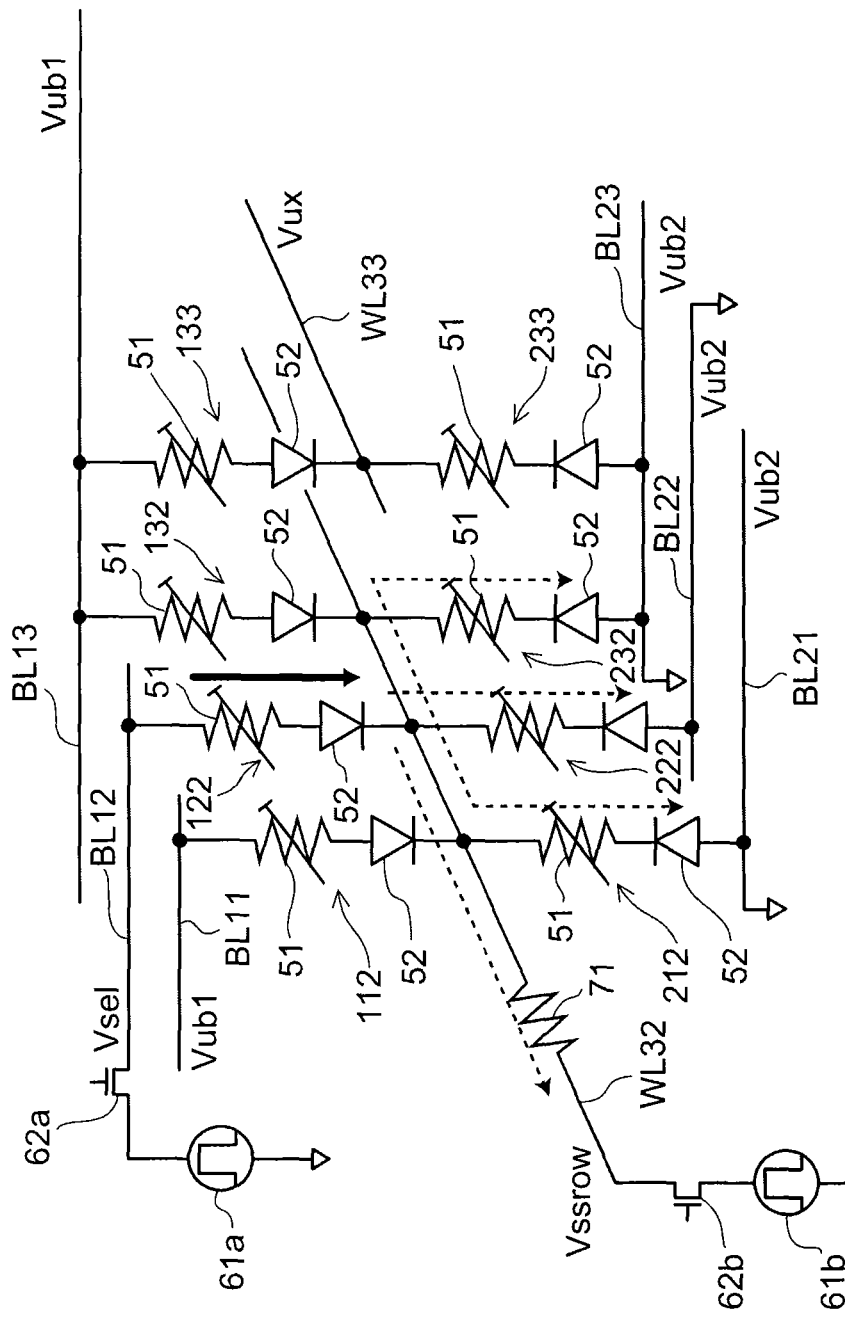
FIG. 3 is a circuit diagram of the memory cell array.

FIG. 3 is a circuit diagram of the memory cell array.

FIG. 3 illustrates, for example, the bit lines BL11, BL12, BL13, BL21, BL22, and BL23, the word lines WL32 and WL33, and the memory cells 112, 122, 132, 133, 212, 222, 232, and 233 in FIG. 2.

Each memory cell has a resistance variation element 51 and a diode 52 that are connected to each other in series. The resistance variation element 51 may electrically switch a relatively low resistance state (set state) and a relatively high resistance state (reset state), and stores data involatilely. The diode 52 prevents sneak current at the time of electrically accessing (forming/writing/erasing/reading) a selected cell.

The bit line BL and the word line WL are, for example, metallic wires. As materials for the bit lines BL and the word lines WL, materials having high heat resistance and low resistance are preferably used, and for example, tungsten, titanium, tantalum, nitride thereof, and the like may be used. Alternatively, the bit lines BL and the word lines WL may have a stacking structure including tungsten, titanium, tantalum, and nitride thereof.

One end of the resistance variation element 51 of the memory cell 112 is connected to the bit line BL11. The diode 52 of the memory cell 112 is connected between the other end of the resistance variation element 51 and the word line WL32. In the diode 52 of the memory cell 112, a direction toward the word line WL32 from the bit line BL11 is set as a forward direction.

One end of the resistance variation element 51 of the memory cell 122 is connected to the bit line BL12. The diode 52 of the memory cell 122 is connected between the other end of the resistance variation element 51 and the word line WL32. In the diode 52 of the memory cell 122, a direction toward the word line WL32 from the bit line BL12 is set as the forward direction.

One end of the resistance variation element 51 of the memory cell 132 is connected to the bit line BL13. The diode 52 of the memory cell 132 is connected between the other end of the resistance variation element 51 and the word line WL32. In the diode 52 of the memory cell 132, a direction toward the word line WL32 from the bit line BL13 is set as the forward direction.

One end of the resistance variation element 51 of the memory cell 133 is connected to the bit line BL13. The diode 52 of the memory cell 133 is connected between the other end of the resistance variation element 51 and the word line WL33. In the diode 52 of the memory cell 133, a direction toward the word line WL33 from the bit line BL13 is set as the forward direction.

One end of the resistance variation element 51 of the memory cell 212 is connected to the word line WL32. The diode 52 of the memory cell 212 is connected between the other end of the resistance variation element 51 and the bit line BL21. In the diode 52 of the memory cell 212, a direction toward the word line WL32 from the bit line BL21 is set as the forward direction.

One end of the resistance variation element 51 of the memory cell 222 is connected to the word line WL32. The diode 52 of the memory cell 222 is connected between the other end of the resistance variation element 51 and the bit line BL22. In the diode 52 of the memory cell 222, a direction toward the word line WL32 from the bit line BL22 is set as the forward direction.

One end of the resistance variation element 51 of the memory cell 232 is connected to the word line WL32. The diode 52 of the memory cell 232 is connected between the other end of the resistance variation element 51 and the bit line BL23. In the diode 52 of the memory cell 232, a direction toward the word line WL32 from the bit line BL23 is set as the forward direction.

The memory cells 112, 122, 132, 212, 222, and 232 share the word line WL32. In the upper memory cells 112, 122, and 132 and the lower memory cells 212, 222, and 232, the direction of the diode 52 is reverse around the word line WL32.

That is, in the diodes 52 of the memory cells 112, 122, and 132, a direction toward a lower layer is set as the forward direction and in the diodes 52 of the memory cells 212, 222, and 232, a direction toward an upper layer is set as the forward direction.

The resistance variation element 51 may be electrically switched to at least two states having relatively different resistances. The state having the relatively low resistance is set as the set state and a state having resistance higher than the set state is set as the reset state. When reset voltage is applied to the resistance variation element 51 in the low-resistance state (set state), the resistance variation element 51 may be switched to a high-resistance state (reset state). When set voltage higher than the reset voltage is applied to the resistance variation element 51 in the high-resistance state (reset state), the resistance variation element 51 may be switched to the low-resistance state (set state).

Herein, for example, a reset operation for the memory cell 122 in FIG. 3 will be described.

In the following description, the memory cell 122 to be reset is also referred to as the selected cell 122 and the memory cell other than the selected cell 122 is also referred to as an non-selected cell.

Further, the word line WL32 connected to the selected cell 122 is also referred to as the selected word line WL32 and the word line not connected to the selected cell 122 is also referred to as an non-selected word line. Further, the bit line BL12 connected to the selected cell 122 is also referred to as the selected bit line BL12 and the bit line not connected to the selected cell 122 is also referred to as an non-selected bit line.

The selected bit line BL12 is connected to a selected bit line power source providing a potential Vsel which is one of constituent components of the bit line driver 30 with a switch 62a interposed therebetween. Further, the non-selected bit line is also connected to a non-selected bit line power source providing a potential Vub1 or Vub2 which is one of the constituent components of the bit line driver 30 with a switch (not illustrated).

The selected word line WL32 is connected to a selected word power source providing a potential Vssrow which is one of constituent components of the word line driver 20 with a switch 62b interposed therebetween. Further, the non-selected word line is also connected to a non-selected word line power source providing a potential Vux which is one of the constituent components of the word line driver 20 with a switch (not illustrated).

When the selected cell 122 is reset, a potential difference is given between the selected bit line BL12 and the selected word line WL32 that sandwich the selected cell 122, and for example, current (reset current) of tens to hundreds µA flows on the selected cell 122. As a result, the resistance variation element 51 of the selected cell 122 is changed from the low-resistance state (set state) to the high-resistance state (reset state).

When a distance between a driver which applies the potential to the wire such as the word line or the bit line and the selected memory cell is long, the voltage drop in the wire by the reset current is also increased. When voltage supplied from the driver is constant, the voltage applied to the memory cell varies depending on the distance between the memory cell and the driver, thereby leading to non-uniformity of a resistance value of the resistance variation element 51 after resetting. For example, voltage applied to the memory cell which is distant from the driver is easily insufficient.

In FIG. 3, only the part where the 3×3 cell arrays are stacked in two layers is illustrated, but actually, for example, a cell array having a very large size such as a 1024×4096 array is included. As a result, when the selected cell of which the distance up to the driver is long is reset, a large voltage drop may occur in the selected bit line or the selected word line.

For example, when the reset current is 100 μA and wiring resistance between the driver and the selected cell is 10 kΩ, the voltage drop is 1.0 V, and even though 4.0 V is supplied from the driver, only 3.0 V is applied to the selected cell, and as a result, the selected cell may not be reset.

Therefore, the embodiment provides a semiconductor memory device that reduces the voltage drop by the wiring resistance. In the embodiment, for example, a case in which a voltage drop by parasitic resistance (schematically denoted by reference numeral 71 in FIG. 3) on the selected word line WL32 is reduced when the selected cell 122 is reset will be described as one example.

FIGS. 4A to 4E are timing charts of potential application when the selected cell 122 is reset. The potential illustrated in each of FIGS. 4A to 4E is given from the bit line driver 30 or the word line driver 20 based on controlling of the control circuit 40 illustrated in FIG. 1.

FIG. 4A illustrates a potential Vsel given to the selected bit line BL12.

FIG. 4B illustrates a potential Vssrow given to the selected word line WL32.

FIG. 4C illustrates a potential Vub1 given to the non-selected bit line BL11 and the non-selected bit line BL13.

FIG. 4D illustrates a potential Vub2 given to the non-selected bit line BL21, the non-selected bit line BL22, and the non-selected bit line BL23.

FIG. 4E illustrates a potential Vux given to the non-selected word line WL33.

The non-selected cells 112, 132, 212, 222, and 232 share the selected cell 122 with the word line WL32. Among the non-selected cells, the selected cells 112 and 132 installed on the same layer (an upper layer of the word line WL32 in FIG. 3) as the selected cell 122 are also referred to as a first non-selected cell. Further, the selected cells 212, 222, and 232 installed on a layer (a lower layer of the word line WL32 in FIG. 3) different from the selected cell 122 are also referred to as a second non-selected cell.

In the timing charts of FIGS. 4A to 4E, a time axis (horizontal axis) is divided into five time periods of T0 to T4.

During the time period T0, the potentials Vsel, Vssrow, Vub1, Vub2, and Vux are 0 V.

During the time period T1, Vsel and Vssrow are increased to 8V, Vub1 is increased to 0.5 V, and Vub2 is increased to 7.5 V.

During the time period T1, Vux is increased to 7.5 V and thereafter, a floating state may be made.

During the time period T2, Vssrow is decreased to 4 V and Vub2 is decreased to 0 V.

During the time period T3, Vsel is decreased to 0 V.

During the time period T4, Vub1 and Vux are decreased to 0 V.

The reset voltage (4 V) is applied to the selected cell 122 only during the time period T2. During the time period T2, the voltage to turn on the diode 52 in the forward direction of the diode 52 is applied to only the selected cell 122 and the reset current flows on the selected cell 122. As a result, the resistance variation element 51 of the selected cell 122 is changed from the low-resistance state (set state) to the high-resistance state (reset state).

The potential of the non-selected word line WL33 connected with the non-selected cells 133 and 233 that do not share the bit line BL12 and the word line WL32 with the selected cell 122 is increased to 7.5 V. Thereafter, the non-selected word line WL33 may be in the floating state. Voltage is applied to the non-selected cells 133 and 233 in a reverse direction to the diode 52. Therefore, during the time period T2, current which is sufficient for resetting does not flow on the non-selected cells 133 and 233, and as a result, the non-selected cells 133 and 233 are not reset.

3.5 V is applied to the non-selected cells (first non-selected cells) 112 and 132 that share the word line WL32 with the selected cell 122 and are installed on the same layer as the selected cell 122 in the reverse direction to the diode 52 during the time period T2. Current that flows on the first non-selected cells 112 and 132 becomes reverse current to the diode 52 and becomes very low current. Therefore, the first non-selected cells 112 and 132 are not reset.

4.0 V is applied to the non-selected cells (second non-selected cells) 212, 222, and 232 that share the word line WL32 with the selected cell 122 and are installed on a different layer (a lower layer of a cell array layer including the selected cell 122 in FIG. 3) from the selected cell 122 in the reverse direction to the diode 52 during the time period T2.

Current that flows on the second non-selected cells 212, 222, and 232 becomes reverse current to the diode 52 and becomes very low current. Therefore, the second non-selected cells 212, 222, and 232 are not reset. When 4.0 V is applied as the reverse voltage to the diode 52, the current that flows on the second non-selected cells 212, 222, and 232 is, for example, approximately 50 nA.

However, when the size of the cell array is large and the number of the second non-selected cells and non-selected bit lines connected thereto that are installed is, for example, 1024, the ability to suck out current of approximately 50 μA to the lower layer from the selected word line WL32 is generated.

In FIG. 3, a thick solid-line arrow indicates the current that flows on the selected cell 122 in resetting and a dotted-line arrow indicates the current that flows on the second non-selected cells 212, 222, and 232 in resetting. The direction of the current that flows on the second non-selected cells 212, 222, and 232 is the same as the direction of the current that flows on the selected cell 122 in resetting, and the current is sucked out to the lower layer from the selected word line WL32 through the second non-selected cells 212, 222, and 232.

For example, when the reset current is 100 μA, approximately 50% thereof may be sucked out to the lower layer, thereby significantly reducing the voltage drop on the selected word line WL32. As a result, the dependency of the selected cell 122 to be reset on the distance from the driver may be reduced and a uniform resetting operation which is not dependent on a bit address on the selected word line WL32 may be performed.

The ability to suck out the current to the lower layer may be controlled by the potential Vub2 given to the non-selected bit lines BL21, BL22, and BL23 on the lower layer.

That is, the control circuit 40 illustrated in FIG. 1 may independently and differently set the potential Vub1 applied to the upper non-selected bit lines BL11 and BL13 respectively connected to the first non-selected cells 112 and 132 connected to the selected word line WL32 on the same layer as the selected cell 122 and the potential Vub2 applied to the lower non-selected bit lines BL21, BL22, and BL23 respectively connected to the second non-selected cells 212, 222, and 232 connected to the selected word line WL32 on the different layer from the selected cell 122 and the first non-selected cells 112 and 132, in resetting.

Subsequently, FIGS. 5A to 5E are timing charts of another detailed example of potential application when the selected cell 122 is reset. The potential illustrated in each of FIGS. 5A to 5E is also given from the bit line driver 30 or the word line driver 20 based on controlling of the control circuit 40 illustrated in FIG. 1.

During the time period T0, the potentials Vsel, Vssrow, Vub1, Vub2, and Vux are 0 V.

During the time period T1, Vsel and Vssrow are increased to 4 V, Vub1 is increased to 0.5 V, and Vub2 is increased to 3.5 V. During the time period T1, Vux is increased to 3.5 V and thereafter, is in the floating state.

During the time period T2, Vssrow is decreased to 0 V and Vub2 is decreased to −4 V.

During the time period T3, Vsel is decreased to 0 V.

During the time period T4, Vub1 and Vux are decreased to 0 V. During the time period T4, Vub2 becomes 0 V.

The reset voltage (4 V) is applied to the selected cell 122 only during the time period T2. During the time period T2, the voltage to turn on the diode 52 in the forward direction of the diode 52 is applied to only the selected cell 122 and the reset current flows on the selected cell 122. As a result, the resistance variation element 51 of the selected cell 122 is changed from the low-resistance state (set state) to the high-resistance state (reset state).

The potential of the non-selected word line WL33 connected with the non-selected cells 133 and 233 that do not share the bit line BL12 and the word line WL32 with the selected cell 122 is increased to 3.5 V. Thereafter, the non-selected word line WL33 may be floating. Voltage is applied to the non-selected cells 133 and 233 in the reverse direction to the diode 52. Therefore, during the time period T2, current which is sufficient for resetting does not flow on the non-selected cells 133 and 233, and as a result, the non-selected cells 133 and 233 are not reset.

0.5 V is applied to the non-selected cells (first non-selected cells) 112 and 132 that share the word line WL32 with the selected cell 122 and are installed on the same layer as the selected cell 122 in the forward direction to the diode 52 during the time period T2. Since the voltage is voltage-divided into the resistance variation element 51 and the diode 52, the voltage to turn on the diode 52 is not applied to the diodes 52 of the first non-selected cells 112 and 132, and as a result, only very low current flows on the diodes 52. Therefore, the first non-selected cells 112 and 132 are not reset.

4.0 V is applied to non-selected cells (second non-selected cells) 212, 222, and 232 that share the word line WL32 with the selected cell 122 and are installed on a different layer (the lower layer of a cell array layer including the selected cell 122 in FIG. 3) from the selected cell 122 in the reverse direction to the diode 52 during the time period T2.

Current that flows on the second non-selected cells 212, 222, and 232 becomes reverse current to the diode 52 and becomes very low current. Therefore, the second non-selected cells 212, 222, and 232 are not reset. When 4.0 V is applied as the reverse voltage to the diode 52, the current that flows on the second non-selected cells 212, 222, and 232 is, for example, approximately 50 nA.

When the number of the second non-selected cells and non-selected bit lines connected thereto that are installed is, for example, 1024, the ability to suck out current of approximately 50 μA to the lower layer from the selected word line WL32 is generated.

For example, when the reset current is 100 μA, approximately 50% thereof may be sucked out to the lower layer, thereby significantly reducing the voltage drop on the selected word line WL32. As a result, the dependency of the selected cell 122 to be reset on the distance from the driver may be reduced and the uniform resetting operation which is not dependent on the bit address on the selected word line WL32 may be performed.

The ability to suck out the current to the lower layer may be controlled by the potential Vub2 given to the non-selected bit lines BL21, BL22, and BL23 on the lower layer.

In the detailed examples of FIGS. 5A to 5E, during the time periods T2 and T3, the potential Vub2 of the non-selected bit lines BL21, BL22, and BL23 respectively connected to the second non-selected cells 212, 222, and 232 is set as a negative potential. As a result, while the maximum value of other potentials is suppressed to approximately 4 V, the reverse voltage of 4 V is applied to the diodes 52 of the second non-selected cells 212, 222, and 232 and may suck out the current to the lower layer from the selected word line WL32 through the second non-selected cells 212, 222, and 232.

Subsequently, an embodiment in which a voltage drop by parasitic resistance (schematically denoted by reference numeral 72 in FIG. 6) on the selected bit line BL12 is reduced when the selected cell 122 is reset will be described.

Figure 6:
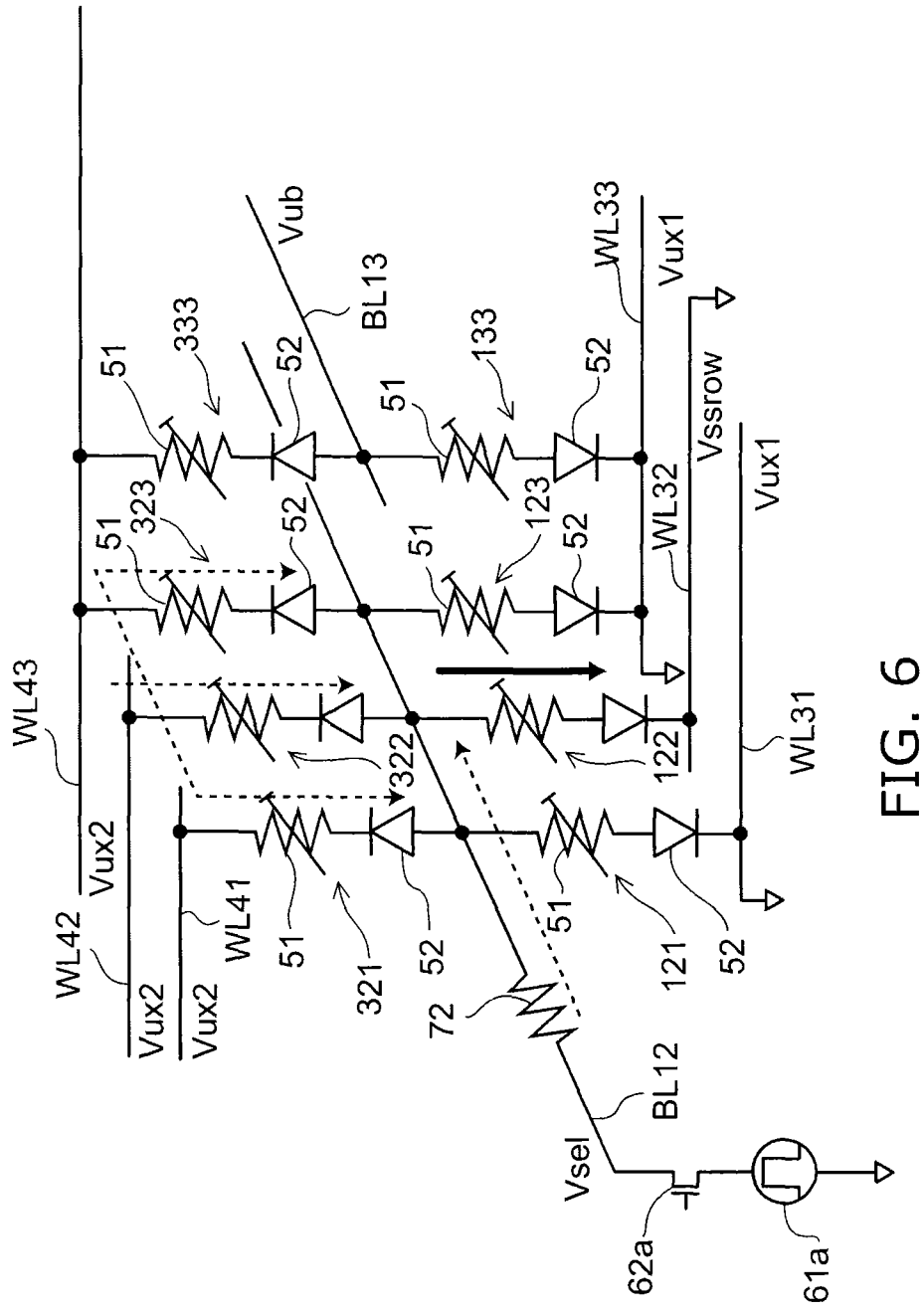
FIG. 6 is a circuit diagram of some of vertical cell arrays that sandwich the selected bit line BL12.

FIG. 6 is a circuit diagram of some of vertical cell arrays that sandwich the selected bit line BL12.

One end of the resistance variation element 51 of the memory cell 321 is connected to the word line WL41. The diode 52 of the memory cell 321 is connected between the other end of the resistance variation element 51 and the bit line BL12. In the diode 52 of the memory cell 321, a direction toward the word line WL41 from the bit line BL12 is set as the forward direction.

One end of the resistance variation element 51 of the memory cell 322 is connected to the word line WL42. The diode 52 of the memory cell 322 is connected between the other end of the resistance variation element 51 and the bit line BL12. In the diode 52 of the memory cell 322, a direction toward the word line WL42 from the bit line BL12 is set as the forward direction.

One end of the resistance variation element 51 of the memory cell 323 is connected to the word line WL43. The diode 52 of the memory cell 332 is connected between the other end of the resistance variation element 51 and the bit line BL12. In the diode 52 of the memory cell 332, a direction toward the word line WL43 from the bit line BL12 is set as the forward direction.

One end of the resistance variation element 51 of the memory cell 121 is connected to the bit line BL12. The diode 52 of the memory cell 121 is connected between the other end of the resistance variation element 51 and the word line WL31. In the diode 52 of the memory cell 121, a direction toward the word line WL31 from the bit line BL12 is set as the forward direction.

One end of the resistance variation element 51 of the memory cell 122 is connected to the bit line BL12. The diode 52 of the memory cell 122 is connected between the other end of the resistance variation element 51 and the word line WL32. In the diode 52 of the memory cell 122, a direction toward the word line WL32 from the bit line BL12 is set as the forward direction.

One end of the resistance variation element 51 of the memory cell 123 is connected to the bit line BL12. The diode 52 of the memory cell 123 is connected between the other end of the resistance variation element 51 and the word line WL33. In the diode 52 of the memory cell 123, a direction toward the word line WL33 from the bit line BL12 is set as the forward direction.

The memory cells 321, 322, 323, 121, 122, and 123 share the bit line BL12. In the upper memory cells 321, 322, and 323 and the lower memory cells 121, 123, and 123, the direction of the diode 52 is reverse around the bit line BL12.

That is, in the diodes 52 of the memory cells 321, 322, and 323, a direction toward the upper layer than the bit line BL12 is set as the forward direction and in the diodes 52 of the memory cells 121, 122, and 123, a direction toward the lower layer than the bit line BL12 is set as the forward direction.

FIGS. 7A to 7E are timing charts of potential application when the selected cell 122 is reset. The potential illustrated in each of FIGS. 7A to 7E is given from the bit line driver 30 or the word line driver 20 based on controlling of the control circuit 40 illustrated in FIG. 1.

FIG. 7A illustrates a potential Vsel given to the selected bit line BL12.

FIG. 7B illustrates a potential Vssrow given to the selected word line WL32.

FIG. 7C illustrates a potential Vub given to the non-selected bit line BL13.

FIG. 7D illustrates a potential Vux1 given to the non-selected word line WL31 and the non-selected word line WL33.

FIG. 7E illustrates a potential Vux2 given to the non-selected word lines WL41, WL42, and WL43.

Even in the timing charts of FIGS. 7A to 7E, the time axis (horizontal axis) is divided into five time periods of T0 to T4.

During the time period T0, the potentials Vsel, Vssrow, Vub, Vux1, and Vux2 are 0 V.

During the time period T1, Vsel and Vssrow are increased to 4 V, Vub is increased to 0.5 V, Vux1 is increased to 3.5 V, and Vux2 is increased to 8 V.

During the time period T2, Vssrow is decreased to 0 V.

During the time period T3, Vsel and Vux2 is decreased to 0V.

During the time period T4, Vub and Vux1 are decreased to 0 V.

The reset voltage (4 V) is applied to the selected cell 122 only during the time period T2. During the time period T2, the voltage to turn on the diode 52 in the forward direction of the diode 52 is applied to only the selected cell 122 and the reset current flows on the selected cell 122. As a result, the resistance variation element 51 of the selected cell 122 is changed from the low-resistance state (set state) to the high-resistance state (reset state).

0.5 V is applied to the non-selected cells (first non-selected cells) 121 and 123 that share the bit line BL12 on the same layer as the selected cell 122 in the forward direction to the diode 52 during the time period T2. Since the voltage is voltage-divided into the resistance variation element 51 and the diode 52, the voltage to turn on the diode 52 is not applied to the diodes 52 of the first non-selected cells 121 and 123, and only very low current flows on the diodes 52. Therefore, the first non-selected cells 121 and 123 are not reset.

The potential of the non-selected bit line BL13 connected with the non-selected cells 133 and 333 that do not share the bit line BL12 and the word line WL32 with the selected cell 122 is increased to 0.5 V. Thereafter, the non-selected bit line BL13 may be in the floating state. Voltage is applied to the non-selected cells 133 and 333 in the reverse direction to the diode 52. Therefore, during the time period T2, current which is sufficient for resetting does not flow on the non-selected cells 133 and 333, and the non-selected cells 133 and 333 are not reset.

4.0 V is applied to non-selected cells (second non-selected cells) 321, 322, and 333 that share the bit line BL12 with the selected cell 122 and are installed on a different layer (the upper layer of the cell array layer including the selected cell 122 in FIG. 6) from the selected cell 122 in the reverse direction to the diode 52 during the time period T2.

Current that flows on the second non-selected cells 321, 322, and 333 becomes reverse current to the diode 52 and becomes very low current. Therefore, the second non-selected cells 321, 322, and 333 are not reset. When 4.0 V is applied as the reverse voltage to the diode 52, the current that flows on the second non-selected cells 321, 322, and 333 is, for example, approximately 50 nA.

However, when the size of the cell array is large and the number of the second non-selected cells and non-selected word lines connected thereto that are installed is, for example, 1024, an ability to supply current of approximately 50 μA to the selected bit line BL12 through the second non-selected cells 321, 322, and 333 is generated.

In FIG. 6, a thick solid-line arrow indicates the current that flows on the selected cell 122 in resetting and a dotted-line arrow indicates the current that flows on the second non-selected cells 321, 322, and 333 in resetting. The direction of the current that flows on the second non-selected cells 321, 322, and 333 is the same as the direction of the current that flows on the selected cell 122 in resetting, and the current is supplied to the selected bit line BL12 through the second non-selected cells 321, 322, and 333 and the voltage drop on the selected bit line BL12 may be significantly reduced. As a result, the dependency of the selected cell 122 to be reset on the distance from the driver may be reduced and the uniform resetting operation which is not dependent on a bit address on the selected bit line BL12 may be performed.

A current supplying ability through the second non-selected cells 321, 322, and 333 may be controlled by the potential Vux2 applied to the non-selected word lines WL41, WL42, and WL43.

That is, the control circuit 40 illustrated in FIG. 1 may independently and differently set the potential Vux1 applied to the lower non-selected world lines WL31 and WL33 respectively connected to the first non-selected cells 121 and 123 connected to the selected bit line BL12 on the same layer as the selected cell 122 and the potential Vux2 applied to the upper non-selected word lines WL41, WL42, and WL43 respectively connected to the second non-selected cells 321, 322, and 323 connected to the selected bit line BL12 on the different layer from the selected cell 122 and the first non-selected cells 121 and 123, in resetting.

According to the embodiment, the invention may also be applied to a so called bipolar operated memory cell of which a state is switched by changing a voltage application direction to the memory cell. That is, when operating current flows on the selected cell, current is sucked out through the lower non-selected cell than the selected cell or current is supplied from the upper non-selected cell than the selected cell, in the same direction as a flowing direction of the operating current, thereby reducing the voltage drop by the wiring resistance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a semiconductor substrate;

a plurality of memory cells 3-dimensionally arranged on the semiconductor substrate;

a plurality of wires stacked in three layers or more with the memory cells interposed thereamong; and a control circuit configured to allow a first current to change a state to flow on a selected cell by applying a first potential difference between a pair of wires that sandwich the selected cell selected from the plurality of memory cells with respect to the semiconductor substrate vertically, and to allow a second current lower than the first current to flow on an non-selected cell in the same direction as the direction of the first current by applying a second potential difference between a pair of wires that sandwich the non-selected cell connected to a wire shared with the selected cell on a different layer from the selected cell.

2. The device according to claim 1, wherein
the memory cell includes
a resistance variation element changing resistance as the state, and
a diode connected to the resistance variation element in series.

3. The device according to claim 2, wherein
the first current flows on the selected cell in a forward direction of a diode of the selected cell by the first potential difference to change the resistance of the selected cell.

4. The device according to claim 2, wherein
the second current flows on the non-selected cell in a reverse direction to a diode of the non-selected cell by the second potential difference.

5. The device according to claim 2, wherein
the first current flows on the selected cell in the forward direction of the diode of the selected cell by the first potential difference and the resistance of the selected cell is changed from a set state to a reset state having higher resistance than the set state.

6. The device according to claim 1, wherein
the first potential difference and the second potential difference are equivalent to each other.

7. The device according to claim 1, wherein
when the second potential difference is applied between the pair of wires sandwiching the non-selected cell, a negative potential is applied to a wire other than the wire shared with the selected cell between the pair of wires.

8. A semiconductor memory device, comprising:
a plurality of memory cells arranged three-dimensionally;
a plurality of wires stacked in three layers or more with the memory cells interposed thereamong; and
a control circuit configured to allow a first current to change a state to flow on a selected cell by applying a first potential difference between a pair of wires that sandwich the selected cell selected from the plurality of memory cells, to apply a second potential difference between a pair of wires sandwiching a first non-selected cell connected to a wire shared with the selected cell on the same layer as the selected cell, and to apply a third potential difference different from the second potential difference between a pair of wires sandwiching a second non-selected cell connected to the wire shared with the selected cell and the first non-selected cell on a different layer from the selected cell and the first non-selected cell.

9. The device according to claim 8, wherein:
when the first current flows on the selected cell by the first potential difference, a third current lower than the first current flows on the second non-selected cell in the same direction as the direction of the first current by the third potential difference.

10. The device according to claim 8, wherein
the memory cell includes
a resistance variation element changing resistance as the state, and
a diode connected to the resistance variation element in series.

11. The device according to claim 10, wherein
the first current flows on the selected cell in a forward direction of a diode of the selected cell by the first potential difference to change the resistance of the selected cell.

12. The device according to claim 10, wherein
a third current flows on the second non-selected cell in a reverse direction to a diode of the second non-selected cell by the third potential difference.

13. The device according to claim 10, wherein
a second current lower than the first current flows on the first non-selected cell in a reverse direction to a diode of the first non-selected cell by the second potential difference.

14. The device according to claim 10, wherein
the first current flows on the selected cell in the forward direction of the diode of the selected cell by the first potential difference and the resistance of the selected cell is changed from a set state to a reset state having higher resistance than the set state.

15. The device according to claim 8, wherein
the third potential difference is larger than the second potential difference.

16. The device according to claim 8, wherein
the first potential difference and the second potential difference are equivalent to each other.

17. The device according to claim 8, wherein
when the third potential difference is applied between the pair of wires sandwiching the second non-selected cell, a negative potential is applied to a wire other than the wire shared with the selected cell between the pair of wires.

* * * * *